United States Patent [19]

Lew

[11] Patent Number: 4,901,018

[45] Date of Patent: Feb. 13, 1990

[54] NUCLEAR MAGNETIC RESONANCE NET ORGANIC FLOWMETER

[76] Inventor: Hyok S. Lew, 7890 Oak St., Arvada, Colo. 80005

[21] Appl. No.: 264,358

[22] Filed: Oct. 31, 1988

Related U.S. Application Data

[63] Continuation-in-part of Ser. No. 56,001, Jun. 1, 1987, Pat. No. 4,788,295.

[51] Int. Cl.[4] .............................................. G01R 33/20
[52] U.S. Cl. ..................................... 324/306; 324/303
[58] Field of Search .................................. 324/300–322

[56] References Cited

U.S. PATENT DOCUMENTS 4,785,245 11/1988 Lew et al. .............................. 324/307

Primary Examiner—Michael J. Tokar

[57] ABSTRACT

A nuclear magnetic resonance flowmeter measuring flow rate of the organic portion only in the flow of mixtures made of aqueous, organic and gaseous components comprises a flow passage disposed intermediate two magnetic poles providing a constant transverse magnetic field generally perpendicular to the central axis of the flow passage, which flow passage extends through a first coil generating a first alternating axial magnetic field parallel to the central axis of the flow passage and oscillating at the Larmor frequency, which first alternating magnetic field is generated in pulses with a frequency substantially greater than the inverse of the spin-lattice relaxation time of the aqueous component in the mixture, and through a second coil downstream to the first coil, that generates a second alternating axial magnetic field oscillating at the Larmor frequency, which second alternating magnetic field is generated in pulses at a frequency substantially greater than the inverse of the spin-lattice relaxation time of the organic component in the mixture. The first alternating magnetic field completely scrambles the nuclei magnetic moments of the aqueous component only, while the second alternating magnetic field completely scrambles the nuclei magnetic moments of the aqueous component and completely or partially scrambles the nuclei magnetic moments of the organic component. A radio frequency receiver including an antenna coil disposed at a midsection of the second coil detects the nuclear magnetic resonance radio frequency emission from the organic component of the mixture, wherein the intensity of the NMR emmission increases as the velocity of the organic component increases. The velocity of the organic component in the mixture as well as the mass or volume fraction of the organic component in the mixture is determined from the intensity of the NMR RF emission from the organic component.

9 Claims, 2 Drawing Sheets

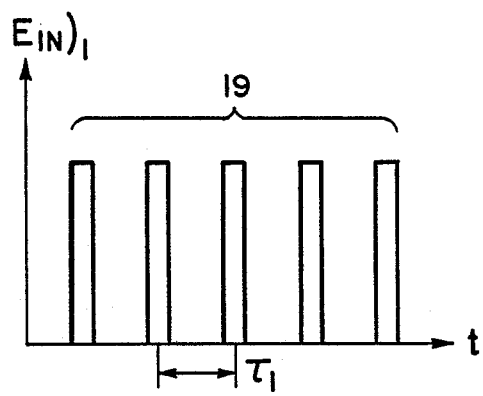
Fig. 3-a
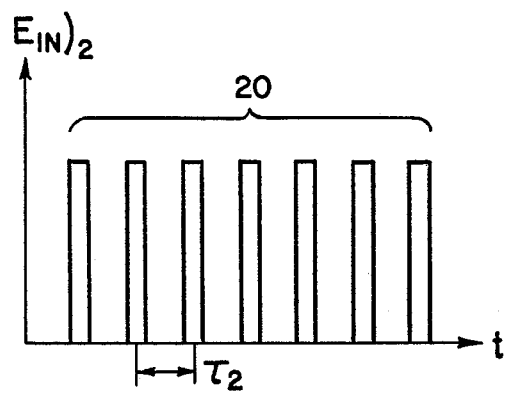
Fig. 3-b
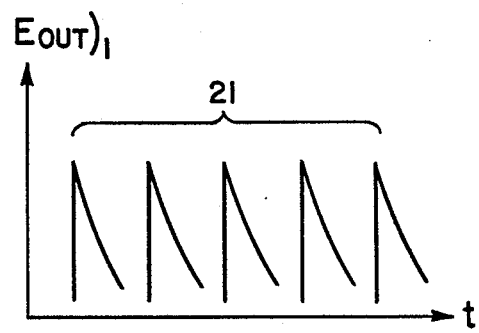
Fig. 4-a
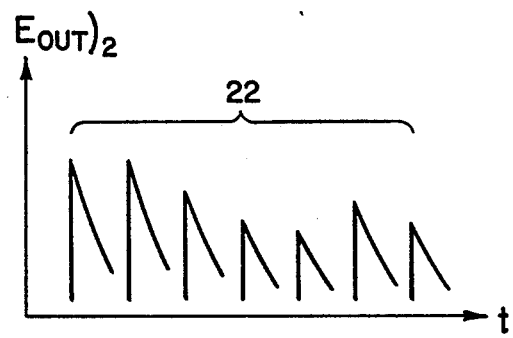
Fig. 4-b
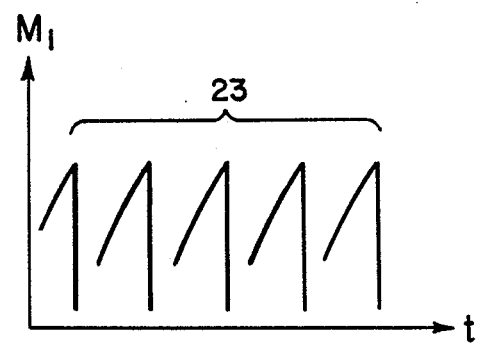
Fig. 5-a
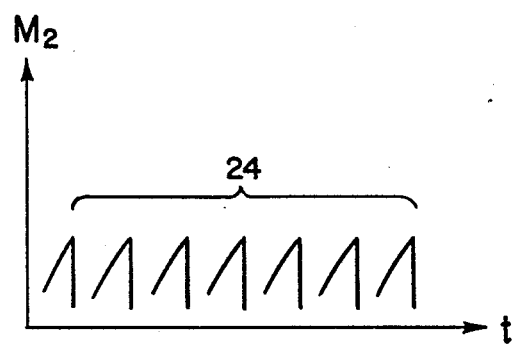
Fig. 5-b
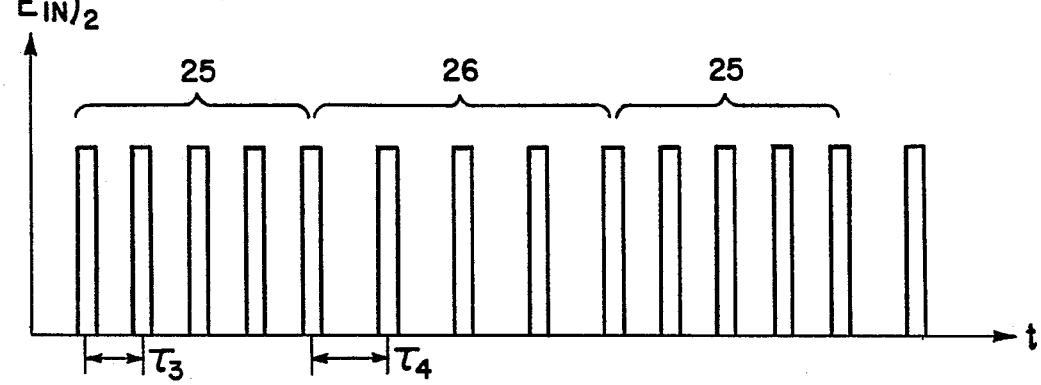
Fig. 6

4,901,018

NUCLEAR MAGNETIC RESONANCE NET ORGANIC FLOWMETER

BACKGROUND OF THE INVENTION

This application is a countinuation-in-part application to patent application Ser. No. 056,001 entitled "Nuclear Magnetic Resonance Flowmeter" filed on June 1, 1987, which is now U.S. Pat. No. 4,788,295.

The principles of nuclear magnetic resonance (NMR) provide an excellent basis to construct and operate a flowmeter that is ideal for measuring very low velocity flows of liquids comprising atoms of nonzero spin such as hydrogen atoms as well as for measuring the volume or mass flow rate of the organic component only. Such applications of the NMR principles have not been practiced at the present time.

BRIEF SUMMARY OF THE INVENTION

The primary object of the present invention is to provide an NMR flowmeter that is capable of measuring very low velocity flows of liquid media.

Another object is to provide an NMR flowmeter measuring the flow rate of the organic component only, wherein the motion of aqueous and gaseous components in the mixture is not registered by the flowmeter.

A further object is to provide an NMR device that measures the volume or mass fraction of the organic component in the mixture.

Yet another object is to provide an NMR flow imaging apparatus that provides images or pictures of the moving liquid medium in contrast to the stationary ambient structures.

Yet a further object is to provide an NMR flowmeter comprising a pair of magnetic poles providing a constant magnetic field generally perpendicular to the direction of the fluid flow, a transmitter coil generating an alternating magnetic field perpendicular to the constant magnetic field, which alternating magnetic field oscillating at the Larmor frequency and generated in pulses completely or partially scrambles the orientation of the nuclei magnetic moments in the fluid media placed within the alternating magnetic field, and a receiver detecting the NMR RF emission from the fluid media; wherein the velocity of the fluid flow is determined from the change in the intensity of the NMR RF emission that varies as a function of the velocity of fluid.

Still another object is to provide an NMR net organic flowmeter comprising a pair of magnetic poles providing a constant magnetic field generally perpendicular to the direction of the fluid flow, a first transmitter coil generating a first alternating magnetic field perpendicular to the constant magnetic field, which first alternating magnetic field oscillating at the Larmor frequency and generated in pulses scrambles nuclei magnetic moments of the aqueous component of the fluid, a second transmitter coil downstream of the first transmitter coil that generates a second alternating magnetic field oscillating at the Larmor frequency in pulses which completely scrambles nuclei magnetic moments of the aqueous component and completely or partially scrambles nuclei magnetic moments of the organic component, and a receiver detecting the NMR RF emission from the organic component of the fluid; wherein the flow rate of the organic component only is determined from the change in the intensity of the NMR RF emission from the organic component that varies as a function of the velocity of the organic component and the constituency fraction of the organic component in the mixture.

Still a further object is to provide an NMR flow imaging device comprising a pair fo magnetic poles providing a constant magnetic field generally perpendicular to the direction of the fluid flow, a transmitter coil generating an alternating magnetic field perpendicular to the constant field and oscillating at the Larmor frequency, which alternating magnetic field generated in pulses scrambles nuclei magnetic moments of the fluid located within the alternating magnetic field, and an image generating receiver, wherein the image or picture of the moving fluid is constructed from the NMR RF emission emitted by the moving fluid.

These and other objects of the present invention will become clear as the description thereof progresses.

BRIEF DESCRIPTION OF THE FIGURES

The present invention may be described with a great clarity and specificity by referring to the following figures:

FIGS. 3-a and 3-b illustrate two pulsed modes of the alternating magnetic fields respectively generated by the two transmitter coils included in the embodiment shown in FIG. 1.

FIGS. 4-a and 4-b illustrate NMR RF emissions from the organic component respectively generated by the two alternating magnetic fields generated by the two transmitter coils, respectively.

FIGS. 5-a and 5-b illustrate magnetization of the organic component taking place in a time interval between the pulses of the alternating magnetic field.

FIG. 6 illustrates two groups of pulsed alternating magnetic fields generated by the downstream end transmitter coil, which two groups of pulsed alternating magnetic fields are generated alternatively one after the other.

DESCRIPTION OF THE ILLUSTRATED EMBODIMENTS

Figure 1:
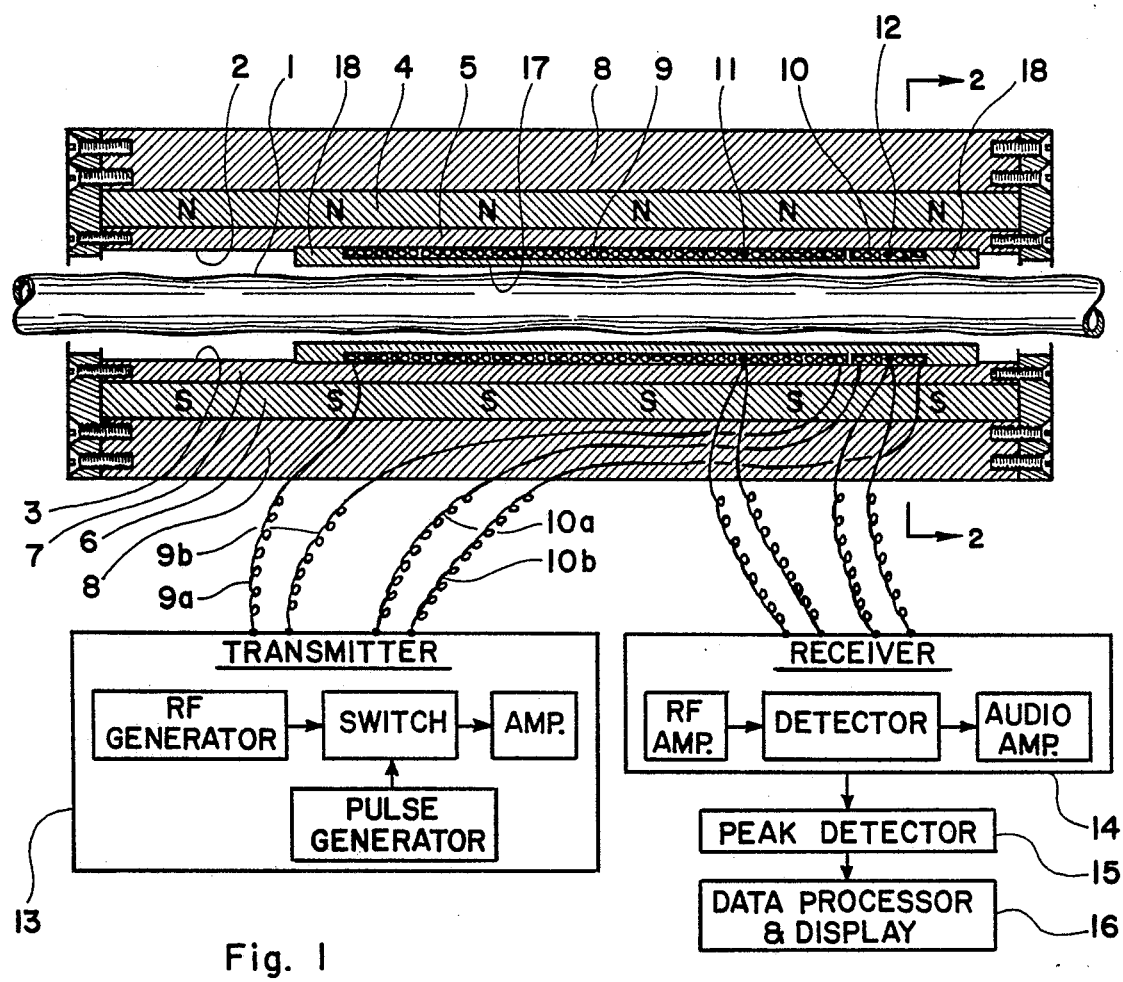
FIG. 1 illustrates a cross section of an embodiment of the NMR net organic flowmeter of the present invention.

In FIG. 1 there is illustrated a cross section of an embodiment of the NMR net organic flowmeter of the present invention, which cross section is taken along a plane including the contral axis of the flow passage 1 disposed intermediate two magnetic poles 2 and 3, which provides a constant magnetic field generally perpendicular to the central axis of the flow passage 1. The two magnetic poles 2 and 3 respectively include the combination of an oblong plate magnet 4 and an oblong flux distributor plate 5, and an oblong plate magnet 6 and an oblong flux distributor plate 7. The two magnetic poles 2 and 3 are connected to one another by a flux guide 8 having a C or U-shaped cross section. A first transmitter coil 9 of a substantial axial length is disposed intermediate the two extremities of the oblong magnetic poles 2 and 3, through which the flow passage 1 extends.

The first transmitter coil 9 extends over a space intermediate the first pair of wires 9a and 9b connecting the transmitter coil 9 to the transmitter electronics 13. A second transmitter coil 10 of a short axial length is disposed intermediate the first transmitter coil 9 and the downstream extremity of the oblong magnetic poles 2 and 3, through which the flow passage 1 also extends through.

The second transmitter coil 10 extends over space intermediate the second pair of wires 10a and 10b connecting the transmitter coil 10 to the transmitter electronics 13. A first receiver or antenna coil 11 is disposed intermediate the two extremities of the first transmitter coil 9, while a second receiver or antenna coil 12 is disposed at a midsection of the second transmitter coil 10. The energizing of transmitter coils 9 and 10 are controlled by a transmitter electronics 13. The NMR RF emissions picked up by the receiver coils 11 and 12 are processed by the receiver electronics 14, wherein the intensity of the NMR RF emissions is detected and analyzed by the peak detector 15 and data processor 16, respectively.

The transmitter electronics 13 comprises two combinations of pulse generator-switch-amplifier arranged in a parallel relationship, wherein outputs from those two combinations respectively energize the two transmitter coils 9 and 10. The RF input to the two combinations of the pulse generator-switch-amplifier may be provided by a single RF wave generator connected thereto in a parallel arrangement or by two separate RF generator respectively connected to the two combinations in a separate arrangement. The RF generator supplies an alternating sinusoidal electrical signal oscillating at the nuclear magnetic resonance frequency of the hydrogen atom in media flowing through the conduit or vessel 1 in a continuous mode. The switch controlled by the pulse generator chops the continuous sinusoidal electrical signal into a train of pulsed sinusoidal electrical signal, wherein the duty period of the pulse and pause period between the pulses are controlled by the pulse generator. The RF amplifier amplifies the pulsed sinusoidal electrical signal to a required level for energizing the transmitter coil. The receiver electronics 14 comprises two combinations of the RF amplifier-detector-audio amplifier, each of which two combinations is fed with the alternating electrical signal oscillating at the nuclear magnetic resonance frequency, that is picked up by each of the two receiver coils 11 and 12, wherein the RF amplifier amplifies the alternating electrical signal supplied thereto by the receiver coil and the detector rid of the RF frequency signal and retrieves the envelope thereof. The audio amplifier amplifies the envelope signal, which decays rapidly after reaching a peak value at the initial stage of each pulse. The peak detector measures the peak value of the envelope signal and the data processor determines the flow rate of the media moving through the conduit or vessel 1 from the peak value of the envelope signal, which may be displayed in a digital or analog form or in an image of the conduit or vessel 1 with the intensity of contrast of the conduit or vessel proportional to the velocity of the fluid moving therethrough.

Figure 2:
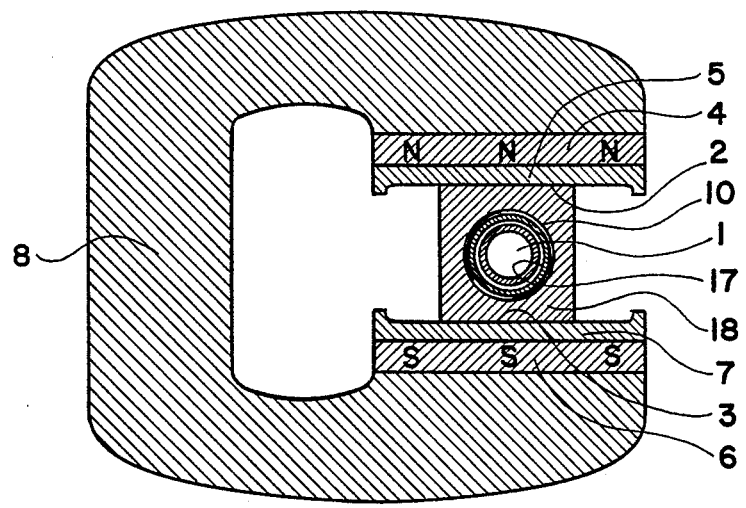
FIG. 2 illustrates another cross section of the embodiment shown in FIG. 1.

In FIG. 2 there is illustrated another cross section of the NMR net organic flowmeter illustrated in FIG. 1, which cross section is taken along plane 2—2 as shown in FIG. 2. The flow passage 1 extends through the transmitter coils 9 and 10 as well as the receiver coils 11 and 12, all of which coils are wound around a cylindrical shell 17, wherein the coil assemblies are held in position by a retainer block 18 secured intermediate the two magnetic poles 2 and 3. The magnetic flux guide 8 provides the closed loop for the constant magnetic field extending from the magnetic pole 2 to the magnetic pole 3, while the magnetic flux distributor plates 5 and 7 provide uniform magnetic field in the space between the two magnetic poles 2 and 3 by eliminating the nonuniformity arising from less than uniform distribution of the magnetic moments within the plate magnets 4 and 6.

In order to understand the operating principles of the present invention, it is useful to investigate a particular mode of operation wherein the downstream transmitter coil 10 generates an alternating magnetic field of Larmor frequency in rapid 90 degree pulses, which completely scramble all nuclei magnetic moments in the fluid element located in the vicinity of the downstream transmitter coil 10 and, consequently, prevents magnetization of the fluid element in the vicinity of the downstream transmitter coil 10 by the constant magnetic field provided by the magnets 4 and 6.

The alternating magnetic field of Larmor frequency, that is perpendicular to the constant external magnetic field and applied in a rapid 90 degree pulses, has a duty period of the pulse matched to change the orientation of the nuclear magnetic moment from the direction parallel to the constant external magnetic field created by the magnetic poles 4 and 6 to a plane generally perpendicular to the constant external magnetic field, and pause period between two consecutive pulses generally smaller than the spin-lattice relaxation time of the NMR signal decay. As a consequence, a stationary fluid element in the vicinity of the downstream transmitter coil 10 does not emit any NMR RF emission.

The nuclei magnetic moments experiencing the change of orientation from the direction parallel to the constant external magnetic field to a new direction perpendicular thereto under a 90 degree pulse experience a dispersion in the orientation due to nonuniform precessing velocities of the individual nuclei magnetic moments, which dispersion in the orientation is the direct cause of the free induction decay of the NMR signal. The series of rapid 90 degree pulses applied at a period significantly smaller than the spin-lattice relaxation time of the NMR signal prevents the regrouping of the nuclei magnetic moments under the influence of the constant external magnetic field and facilitates the dispersion of the nuclei magnetic moment. In order words, the rapid 90 degree pulses scrambles the nuclei magnetic moment. The nuclei magnetic moments at a scrambled state do not emit NMR RF emission. A fluid element with magnetization M located in the vicinity of the downstream transmitter coil 10 and at a section of the flow passage 1 of axial distance X measured from the cross section of the flow passage 1 whereon the downstream receiver coil 12 is located, 12 emits NMR RF emission with free induction decay (FID) peak value E approximately equal to $$E = K_1 M e^{-(\frac{X}{L})^2}, \qquad (1)$$

where $K_1$ is a constant of proportionality and L is a characteristic length comparable to the diameter of the receiver coil 12. According to equation (1), a fluid element with magnetization M freshly moving into the vicinity of the downstream transmitter coil 12 will emit a single pulse of NMR RF emission before it becomes scrambled by the rapid series of 90 degree pulses of the alternating magnetic field generated by the downstream transmitter coil 10, which has an FID peak approximately equal to $$E = K_1 M e^{-(\frac{S-U\tau_2}{L})^2}, \quad (2)$$

where S is the distance between the downstream end of the upstream transmitter coil 9 and the downstream receiver coil 12, that is generally equal to one half of the axial length of the downstream transmitter coil 10, U is the velocity of the fluid element, and $\tau_2$ is the pause time between the 90 degree pulses of alternating magnetic field generated by the downstream transmitter coil 10. The fluid element in the vicinity of the upstream transmitter coil 9 attains a magnetization M during the pause time $\tau_2$ between the 90 degree pulses of alternating magnetic field generated by the upstream transmitter coil 9, which magnetization is approximately given by equation $$M = K_2 \phi H_0^{\frac{3}{2}} \left(1 - e^{-\frac{\tau_1}{T}}\right), \quad (3)$$

where $K_2$ is a constant of proportionality, $\phi$ is the volume fraction of fluid component that has nonzero spin, $H_0$ is the intensity of the constant magnetic field provided by the magnets 4 and 6, $\tau_1$ is the period between the 90 degree pulses of alternating magnetic field generated by the upstream transmitter coil 9, and T is the spin-lattice relaxation time. Substitution of equation (3) into equation (2) yields $$E = \phi E_0 \left(1 - e^{-\frac{\tau_1}{T}}\right) e^{-(\frac{S-U\tau_2}{L})^2}, \quad (4)$$

where $E_0 = K_1 K_2 H_0^{3/2}$.

If the fluid is a homogeneous medium and there is no upstream transmitter coil 9, equation (4) reduces to $$E = E_0 e^{-(\frac{S-U\tau_2}{L})^2}. \quad (5)$$

When $E_o$ is a constant and has a known value determined empirically, the fluid velocity U is determined from the FID peak E in accordance with equation (5) or corresponding relationship determined empirically. If $E_o$ is unknown or variable, the fluid velocity is determined from the following equation or empirically determined counter-part thereof, $$\frac{E_i}{E_j} = e^{-(\frac{S-U\tau_i}{L})^2} / e^{-(\frac{S-U\tau_j}{L})^2}, \quad (6)$$

where $\tau_i$ and $\tau_j$ respectively stand for two different value of the pause time between the 90 degree pulses, and $E_i$ and $E_j$ are measured FID peaks respectively generated by the 90 degree pulses of pause time $\tau_i$ and $\tau_j$. In summary, NMR flowmeter comprising a transmitter coil generating 90 degree pulses of the alternating magnetic field of Larmor frequency determines the velocity of homogeneous fluid medium from the measured FID peak or from the ratio of the two FID peaks respectively generated by two sets of 90 degree pulses having two different pause times.

The spin-lattice relaxation time of the aqueous component in aqueous-organic mixtures is generally equal to 5 to 6 seconds, while that of the organic component is generally equal to 100 to 150 milli-seconds. When the 90 degree pulses are generated at a pause time equal to or less than 20 milli-seconds, the FID peak emitted by the aqueous media is less than 1 percent of that emitted by the organic liquid media for temperatures equal to or greater than 15° C. In other words, 90 degree pulses of pause time equal to or less than 20 milli-seconds completely scramble the nuclei magnetic moments of the aqueous media, while it scrambles only partially the nuclei magnetic moments of the organic liquid media, which is the obvious consequence of the large difference in the spin-lattice relaxation time between the aqueous and organic liquid media. Consequently, as long as the numerical values of $\tau_1$ and $\tau_2$ appearing in equation (4) are kept at values smaller than 20 milli-seconds, the existance of the aqueous component in the mixture can be ignored in analyzing the NMR RF emissions, as the organic component is responsible for 99 percent of the NMR RF emissions. It has now become clear why the NMR flowmeter comprising two transmitter coils 9 and 10 is called net organic flowmeter. The upstream transmitter coil 9 suppresses NMR RF emission from the aqueous component in the mixture, while the downstream transmitter coil 10 generates NMR RF emission from the organic component only. It is readily recognized that equation (4) can be written in the form $$E_2 = E_1 e^{-(\frac{S-U\tau_2}{L})^2}, \quad (7)$$

where $E_1$ is the FID peak detected by the upstream receiver coil 11, while $E_2$ is the FID peak detected by the downstream receiver coil 12. The velocity of the organic component in the mixture is determined from equation (7) or empirically determined counter-part thereof. The volume fraction $\phi$ of the organic component can be determined from the following equation or empirically determined counter-part thereof:

$$E_1 = \phi E_0 \left(1 - e^{-\frac{\tau_1}{T}}\right), \quad (8)$$

wherein empirically determined value corresponding to the FID peak of NMR RF emission of fully magnetized 100 percent organic medium is used for the numerical value of $E_o$. It should be noticed that equations (6) and (7) have the same form, which implies that the two different values of the FID peak appearing in the respective equation may be measured by the downstream receiver coil only operating under two different values of $\tau$, or may be respectively measured by the upstream and downstream receiver coils.

It should be understood that, when the transmitter coil 10 generates alternating magnetic field of Lamor frequency in rapid pulses with pause time between pulses substantially less than the spin-lattice relaxation time, which completely scrambles all nuclei magnetic moments in the fluid element located in the vicinity of the transmitter coil 10, the receiver coil 12 detects NMR RF emission emitted by the moving media only, wherein the FID peak thereof is a function of the velocity of moving media. When the receiver electronics detecting and processing the NMR RF emission emitted by the moving media only is an imaging type, the image or picture of the moving media is obtained wherein the intensity of contrast against the background approximately represents the velocity of moving media. The flow imaging apparatus of the present invention having the same construction as the embodiment shown in FIGS. 1 and 2 less the upstream transmission and receiver coils 9 and 11, and plus a imaging receiver detecting and processing NMR RF emissions exclusively emitted by moving media only has an important medical application, as such an apparatus provides image of the fluid flow in different organs in human body.

The generalized mode of operations of the NMR flowmeter can be better explained by referring to FIGS. 3, 4, 5 and 6. FIGS. 3-a and 3-b respectively illustrate pulsed mode of generating alternating magnetic fields of the Larmor frequency by the upstream and downstream transmitter coils 9 and 10. The upstream transmitter coil generates the alternating magnetic field of the Larmor frequency in a series of 90 degree pulses 19 with a pause time $\tau_1$, while the downstream transmitter coil 10 generates the alternating magnetic field of the Larmor frequency in a series of 90 degree pulses 20 with a pause time $\tau_2$.

FIG. 4-a illustrates a series of FID signals 21 generated by the upstream transmitter coil 9 and picked up by the upstream receiver coil 11, while FIG. 4-b illustrates a series of FID signals 22 generated by the downstream transmitter coil 10 and picked up by the downstream receiver coil 12. The upstream transmitter coil 9 of a substantial axial length generates FID signals with initial peak value varying with the volume fraction $\phi$ and independent of the fluid velocity, which initial peak is approximately given by equation (8). If the length of the upstream transmitter coil 9 is relatively short, the FID peak detected by the upstream receiver coil 11 depends on the volume fraction $\phi$ as well as the fluid velocity and is given approximately by equation $$E_1 = \phi E_0 \left[ \left(1 - e^{-\frac{\tau_1}{T}}\right) e^{-(\frac{U\tau_1}{L})^2} + e^{-(\frac{S_1 - U\tau_1}{L})^2} \right], \quad (9)$$

where $S_1$ is a charateristic length approximately equal to the distance between the upstream end of the upstream transmitter coil 9 and the upstream receiver coil 11. The FID peak detected by the downstream receiver coil 12 is approximately given by equation $$E_2 = \phi E_0 \left(1 - e^{-\frac{\tau_1}{T}}\right) \left[ \left(1 - e^{-\frac{\tau_2}{T}}\right) e^{-(\frac{U\tau_2}{L})^2} + e^{-(\frac{S_2 - U\tau_2}{L})^2} \right], \quad (10)$$

Where $S_2$ is a characteristic length approximately equal to the distance between the downstream end of the upstream transmitter coil 9 and the downstream receiver coil 12.

In FIGS. 6-a and 6-b, there is illustrated the series of remagnetization curves 23 and 24 respectively representing the magnetization of the fluid elements located in the vicinities of the upstream and downstream transmitter coils 9 and 10, respectively, which remagnetization $M_1$ or $M_2$ taking place during the pause time $\tau_1$ or $\tau_2$ between the 90 degree pulses are approximately given by equation $$M_i = \phi E_0 \left(1 - e^{-\frac{\tau_i}{T}}\right), \text{ where } i = 1 \text{ or } 2. \quad (11)$$

It is noticed that the degree of remagnetization becomes lesser and lesser as the pause time $\tau$ becomes smaller and smaller. The remagnetization completely vanishes when the pause time $\tau$ is much smaller than the spin-lattice relaxation time T.

FIG. 6 illustrates a compound mode of generating an alternating magnetic field of the Larmor frequency by a sigle transmitter coil, that includes two sets of 90 degree pulses 25 and 26 respectively having pause times $\tau_3$ and $\tau_4$ and applied in an alternatively repeating mode. A single transmitter coil energized in this mode of pulses can duplicate the function of the two separate transmitter coils, of which functions are described in conjunction with FIGS. 3, 4 and 5.

The first version of NMR flowmeter constructed in accordance with the principles of the present invention comprises a single transmitter coil disposed within a constant magnetic field, that generates an alternating magnetic field oscillating at the Larmor frequency, which alternating magnetic field is perpendicular to the constant magnetic field and generated in 90 degree pulses. The FID peak of the NMR RF emission picked up by a receiver coil disposed at a midsection of the transmitter coil is given by equation (9). In case of measuring flows of homogeneous media, $\phi = 1$ and $E_0$ has a constant value determined empirically. Therefore, the fluid velocity U is determined from equation (1) or empirically determined counter-part thereof. If the fluid is a multiphase media and/or $E_0$ is a variable sensitively depending on temperature and other state variables, the fluid velocity U is determined from the ratio of two FID peaks respectively generated by two sets of 90 degree pulses having different pause times as illustrated in FIG. 6, which ratio of the two FID peaks is given by equation $$\frac{E_i}{E_j} = \frac{\left(1 - e^{-\frac{\tau_i}{T}}\right) e^{-(\frac{U\tau_i}{L})^2} - e^{-(\frac{S_1 - U\tau_i}{L})^2}}{\left(1 - e^{-\frac{\tau_j}{T}}\right) e^{-(\frac{U\tau_j}{L})^2} - e^{-(\frac{S_1 - U\tau_j}{L})^2}}. \quad (12)$$

While the fluid velocity U is determined from equation (12) or empirically determined counter-part thereof. The phase component fraction $\phi$ is determined from equation (9) or empirically determined counter-part thereof.

The second version of NMR flowmeter of the present invention comprises two transmitter coils disposed within the constant magnetic field, which coils respectively generate alternating magnetic fields of the Larmor frequency in pulses with different pause times from one another. The upstream transmitter coil scrambles nuclei magnetic moments in the aqueous phase of mixture, while a receiver coil disposed at a midsection of the downstream transmitter coil detects FID peaks generated by the pulsed alternating magnetic field generated by the downstream transmitter coil. The fluid velocity U and the phase component fraction $\phi$ are determined by the same method as that of the NMR flowmeter comprising a single transmitter coil described by the preceding paragraphs.

The third version of NMR flowmeter of the present invention comprises two transmitter coils and two receiver coils respectively included in a midsection of the two transmitter coils, wherein the two receiver coils pick up FID peaks respectively generated by the two transmitter coils, which FID peaks are respectively given by equations (9) and (10). The fluid velocity U is determined from the ratio of the two FID peaks respectively given by equations (9) and (10) or empirically determined relationship corresponding to the FID ratio, and the phase component fraction $\phi$ is determined from one of the two equations (9) and (10) or empirically determined counter-part thereof.

In nonimaging type NMR flowmeter of the present invention, the magnet 4 and 6 must provide a uniform magnetic field in region within the section of the flow passage 1, which region is surrounded by the transmitter coil or coils, whereby, the nuclei magnetic moments in this region experience the NMR precession under the alternating magnetic field of Larmor frequency created by the transmitter coil or coils. In flow imaging apparatus operating on the intensity of the NMR signal proportional to the fluid velocity, the external magnetic field provided by the magnet 4 and 6 should have a gradient in the axial direction of the flow passage, whereby only the nuclei magnetic moments located on a slice of cross section of the flow passage 1 adjacent to the receiver coil experiences the NMR precession. The image of the fluid flow taken along that cross section is generated from the NMR emission from those nuclei magnetic moments in the fluid occupying that slice of cross section of the flow passage. The image of the fluid flow can be constructed from the NMR emission by using the method called "VOXEL" system, that is presently employed in the medical nuclear magnetic imaging technology. The "VOXEL" system employs a pair of transverse gradient magnetic coils respectively generating a pair of mutually orthorgonal auxiliary external magnetic fields perpendicular to the primary magnetic field of the magnet 4 and 6. This auxiliary external magnetic fields with gradient are employed to generate NMR emission with frequencies varying in the two transverse direction, whereby a Fourier transform of the NMR signals emitted from the nuclei magnetic moments occupying the slice of cross section of the flow passage transforms the planar space domain on that cross section of the flow passage into a frequency domain, whereby NMR emission of different frequencies respectively represent NMR emission from different VOXEL on that cross section of the flow passage. It should be mentioned that, in place of the magnet 4 and 6 providing a constant external magnetic field perpendicular to the central axis of the flow passage, a magnet providing a constant external field parallel to the central axis of the flow passage may be employed, which arrangement provides an advantage in disposing the pair of transverse gradient coils respectively creating a pair of auxiliary external magnetic fields with gradient in two mutually orthogonal directions across the cross section of the flow passage, which auxiliary external magnetic fields enables one to apply the Fourier transform converting the planar physical plane of the cross eection of the flow passage into a frequency domain.

It should be understood that, in contrast to the transmitter coil and receiver coils employed in the illustrated embodiments which have axis thereof parallel to the axis of the flow passage, one or both transmitter coils and receiver coils employed in the NMR flowmeter may be disposed adjacent and eccentrically to the flow passage wherein the axis of the transmitter and receiver coils are perpendicular to the constant magnetic field magnetizing the nuclei magnetic moments. The fundamental embodiment of the flow imaging apparatus of the present invention comprises a transmitter coil with axis perpendicular to the constant magnetic field disposed within the constant magnetic field and a plurality of receiver coils of small diameters disposed on a midsection of the flow passage including the transmitter coil wherein the axis of the receiver coils may be perpendicular to the constant magnetic field or converge to the central axis of the flow passage. There may be a RF hollow cylindrical shield housing the flow passage, which is separated into two halves by a narrow gap in the midsection thereof, whereby the FID peaks detected by the plurality of peripherally disposed receiver coils pick up NMR signals emitted from the media positioned on a cross section including the gap in the shield. A computer program converts the FID peaks detected by the plurality of receiver coils into a image or picture showing the fluid motion moving across the cross section. In addition or alternative to the cylindrical shell shield with the gap, a constant magnetic field magnetizing the nuclei magnetic moments may be provided with a gradient in the direction parallel to the central axis of the flow passage, whereby the alternating magnetic field of a specific Larmor frequency generated by the transmitter coil energizes the nuclei magnetic moments located on the particular cross section only and, consequently, NMR signals picked up by the plurality of peripherally disposed receiver coils are automatically limited to those emitted from the moving media located on that particular cross section.

While the principles of the present invention have now been made clear by the illustrative embodiments, there will be many obvious modifications of the structures, arrangements, proportions, elements and materials, which are particularly adapted to the specific working environments and operating conditions in the practice of the invention without departing from those principles. It is not desired to limit the inventions to the particular illustrated embodiments shown and, accordingly, all suitable modifications and equivalents may be resorted to falling within the scope of the inventions as defined by the claims which follow.

The emobdiments of the invention in which an exclusive proporty or priviledge is claimed, are as follows:

1. An apparatus for measuring flow rate of media moving through a flow passage comprising in combination:
   (a) a magnet providing a generally constant magnetic field in a region including a segment of the flow passage;
   (b) a transmitter coil disposed in said region generating a series of localized pulsed alternating magnetic field generally perpendicular to the constant magnetic field, wherein said pulsed alternating magnetic field oscillates at a nuclear magnetic resonance frequency of the media and a pause time between two consecutive pulses of the altrnating magnetic field is significantly less than a spin-lattice relaxation time of a nuclear magnetic resonance emission from the media;
   (c) a receiver antenna disposed adjacent to said transmitter coil picking up nuclear magnetic resonance emission emitted by a localized volume of the media located in a vicinity of said receiver antenna, said nuclear magnetic resonance emission generated by said pulsed alternating magnetic field;

(d) means for measuring peak values of a series of pulsed nuclear magnetic resonance emissions from the media generated by said series of pulsed alternating magnetic fields and picked up by said receiver antenna; and (e) means for determining flow rate of the media from the peak values of said series of pulsed nuclear magnetic resonance emissions in a range of flow rate wherein the peak value monotonically increases as a function of increasing flow rate of the media.

2. The combination as set forth in claim 1 wherein said transmitter coil generates two series of pulsed alternating magnetic fields with two different pause times in an alternating mode, wherein pause time between two consecutive pulses of the alternating magnetic field in at least one of said two series of pulsed alternating magnetic fields is significantly less than the spin-lattice relaxation time, and flow rate of the media is determined from a ratio of two peak values respectively belonging to said two series of pulsed alternating magnetic fields.

3. An apparatus for measuring flow rate of an aqueous-organic mixture moving through a flow passage comprising in combination:

(a) a magnet providing a generally constant magnetic field in a region including a segment of the flow passage;

(b) a first transmitter coil disposed in said region generating a first series of localized pulsed alternating magnetic field generally perpendicular to the constant magnetic field, wherein said first pulsed alternating magnetic field oscillates at a nuclear magnetic resonance frequency of the mixture and pause time between two consecutive pulses of said first alternating magnetic field is significantly less than spin-lattice relaxation time of nuclear magnetic resonance emission from an organic component of the mixture;

(c) a first receiver antenna disposed adjacent to said first transmitter coil picking up nuclear magnetic resonance emission emitted by a localized volume of the media located in a vicinity of said first receiver antenna, said nuclear magnetic resonance emission generated by said first pulsed alternating magnetic field;

(d) a second transmitter coil disposed upstream of said first transmitter coil in said region, said second transmitter coil generating a second series of localized pulsed alternating magnetic fields generally perpendicular to the constant magnetic field, wherein said second pulsed alternating magnetic field oscillates at a nuclear magnetic resonance frequency of the mixture and pause time between two consecutive pulses of said second alternating magnetic field is significantly less than spin-lattice relaxation time of nuclear magnetic resonance emission from the aqueous component of the mixture; said second pulsed alternating magnetic field suppressing magnetization of the aqueous component under the constant magnetic field, thereby limiting nuclear magnetic resonance emission to the organic component;

(e) means for measuring peak values of a series of pulsed nuclear magnetic resonance emissions from the organic component of the mixture generated by said first series of pulsed alternating magnetic field and picked up by said first receiver antenna; and (f) means for determining flow rate of the organic component of the mixture from the peak values of said series of pulsed nuclear magnetic emissions in a range of flow rate wherein the peak value monotonically increases as a function of increasing flow rate of the organic component of the mixture.

4. The combination as set forth in claim 3 wherein said first transmitter coil generates two series of pulsed alternating magnetic fields with two different pause times in an alternating mode, wherein pause time between two consecutive pulses of the alternating magnetic field in at least one of said two series of pulsed alternating magnetic fields is significantly less than the spin-lattice relaxation time of the nuclear magnetic resonance emission from the organic component of the mixture, and flow rate of the organic component of the mixture is determined from a ratio of two peak values respectively belonging to said series of pulsed alternating magnetic fields.

5. The combination as set forth in claim 3 wherein said combination includes a second receiver antenna disposed adjacent to said second transmitter coil picking up nuclear magnetic resonance emission from a localized volume of the organic component located in the vicinity of said second receiver antenna, said nuclear magnetic resonance emission generated by said second pulsed alternating magnetic field, and further includes means for determining relative abundance of the organic component in the mixture from the peak value of series of pulsed nuclear magnetic resonance emission generated by said second series of pulsed alternating magnetic field and picked up by said second receiver antenna.

6. The combination as set forth in claim 5 wherein said first transmitter coil generates two series of pulsed alternating magnetic fields with two different pause times in an alternating mode, wherein pause time between two consecutive pulses of the alternating magnetic field in at least one of said two series of pulsed alternating magnetic fields is significantly less than the spin-lattice relaxation time of the nuclear megnetic resonance emission from the organic component of the mixture, and flow rate of the organic component of the mixture is determined from a ratio of two peak values respectively belonging to said series of pulsed alternating magnetic fields.

7. A flow imaging apparatus for constructing an image of media moving through a hidden flow passage comprising in combination:

(a) a magnet providing a generally constant magnetic field in a region including a segment of the flow passage, said magnetic field having a gradient in a first direction;

(b) a transmitter coil disposed in said region generating a series of localized pulsed alternating magnetic field generally perpendicular to said generally constant magnetic field, wherein said pulsed alternating magnetic field oscillates at a nuclear magnetic resonance frequency of a planar volume of the media located on an image plane generally perpendicular to said first direction, and pause time between two consecutive pulses of the alternating magnetic field is significantly less than a spin-lattice relaxation time of a nuclear magnetic resonance emission from the media;

(c) a receiver antenna disposed adjacent to said image plane picking up nuclear magnetic resonance emission emitted from said planar volume of the media, said nuclear magnetic resonance emission generated by said pulsed alternating magnetic field;

(d) means for detecting a plurality of peak values of pulsed nuclear magnetic resonance emissions representing nuclear magnetic resonance emissions respectively emitted from a plurality of subdivisions of said planar volume of the media subdivided on said image plane; and (e) means for constructing an image of the flow passage taken along said image plane from said plurality of peak values of pulsed nuclear magnetic resonance emissions.

8. The combination as set forth in claim 7 wherein said combination includes another transmitter coil disposed upstream of said transmitter coil in said region, said another transmitter coil generating a series of localized pulsed alternating magnetic fields generally perpendicular to said generally constant magnetic field, wherein the pulsed alternating magnetic field generated by said another transmitter coil oscillates at the nuclear magnetic resonance frequency of the media located adjacent to said another transmitter coil and pause time between two consecutive pulses of the alternating magnetic field generated by said another transmitter coil is significantly less than spin-lattice relaxation time of nuclear magnetic resonance emission from aqueous component of the media, the pulsed alternating magnetic field generated by said another transmitter coil suppressing magnetization of the aqueous component of the media, thereby limiting nuclear magnetic resonance emission to an organic component of the media and, consequently, said image of the flow represents flow of the organic component only.

9. The combination as set forth in claim 8 wherein said combination includes another receiver antenna disposed adjacent to said another transmitter coil picking up nuclear magnetic resonance emission from a localized volume of the organic component of the media located adjacent to said another receiver antenna, said nuclear magnetic resonance emission generated by the pulsed alternating magnetic field created by said another transmitter coil, and further includes means for determining relative abundance of the organic component in the media from a peak value of a series of pulsed nuclear magnetic resonance emission generated by the series of pulsed alternating magnetic field created by said another transmitter coil and picked up by said another receiver antenna.

* * * * *